US008289083B2

(12) United States Patent
Menon et al.

(10) Patent No.: US 8,289,083 B2
(45) Date of Patent: Oct. 16, 2012

(54) ACTIVE POWER SPLITTER (75) Inventors: Gaurav Menon, San Diego, CA (US); Nitin Jain, San Diego, CA (US); David W. Corman, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 161 days.

(21) Appl. No.: 12/759,148

(22) Filed: Apr. 13, 2010

(65) Prior Publication Data

US 2010/0259312 A1    Oct. 14, 2010

Related U.S. Application Data (60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H03F 3/68* (2006.01)
(52) U.S. Cl. .................. 330/295; 330/252; 330/253
(58) Field of Classification Search ............. 330/124 R, 330/252, 253, 295
See application file for complete search history.

(56) References Cited

U.S. PATENT DOCUMENTS

| 3,119,965 | A |   | 1/1964  | Phillips         |         |
|-----------|---|---|---------|------------------|---------|
| 4,857,777 | A |   | 8/1989  | Altes            |         |
| 4,896,374 | A |   | 1/1990  | Waugh et al.     |         |
| 4,965,602 | A |   | 10/1990 | Kahrilas et al.  |         |
| 4,994,773 | A |   | 2/1991  | Chen et al.      |         |
| 5,045,822 | A | * | 9/1991  | Mohwinkel        | 333/124 |
| 5,270,719 | A |   | 12/1993 | Roth             |         |
| 5,942,929 | A | * | 8/1999  | Aparin           | 327/233 |
| 5,966,049 | A |   | 10/1999 | Yuen et al.      |         |
| 6,005,515 | A |   | 12/1999 | Allen et al.     |         |
| 6,061,553 | A |   | 5/2000  | Matsuoka et al.  |         |
| 6,232,837 | B1|   | 5/2001  | Yoo et al.       |         |
| 6,326,845 | B1|   | 12/2001 | Miyaji et al.    |         |
| 7,319,345 | B2|   | 1/2008  | Farjad-rad et al.|         |
| 7,355,470 | B2|   | 4/2008  | Sorrells et al.  |         |
| 7,378,902 | B2|   | 5/2008  | Sorrells et al.  |         |
| 7,400,193 | B2| * | 7/2008  | Wyatt            | 330/295 |

(Continued)

FOREIGN PATENT DOCUMENTS

EP         0762660        3/1997

(Continued)

OTHER PUBLICATIONS

International Search Report and Written Opinion dated Oct. 27, 2010, PCT/US10/030876, 8 pages.

(Continued)

*Primary Examiner* — Khanh V Nguyen
(74) *Attorney, Agent, or Firm* — Snell & Wilmer (57) ABSTRACT

A circuit topology in accordance with a system, method and device for an active power splitter with an input and at least two outputs which allows the use of negative feedback and thus improving stability and linearity without substantially increasing the noise figure of the system is provided.

19 Claims, 7 Drawing Sheets

U.S. PATENT DOCUMENTS

| | | | |
|---|---|---|---|
| 7,408,507 | B1 | 8/2008 | Paek et al. |
| 7,420,423 | B2 | 9/2008 | Lee et al. |
| 7,421,036 | B2 | 9/2008 | Sorrells et al. |
| 7,620,129 | B2 | 11/2009 | Sorrells et al. |
| 7,672,653 | B2 | 3/2010 | Cowley et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 * | 7/2010 | Imagawa .................. 330/295 |
| 7,885,682 | B2 | 2/2011 | Sorrells et al. |
| 8,013,784 | B2 | 9/2011 | Margomenos et al. |
| 2002/0113648 | A1 | 8/2002 | Miyaji et al. |
| 2003/0016085 | A1 | 1/2003 | Yamazaki |
| 2003/0162566 | A1 | 8/2003 | Shapira et al. |
| 2004/0095190 | A1 | 5/2004 | Klaren |
| 2004/0121750 | A1 | 6/2004 | Nation |
| 2004/0229584 | A1 | 11/2004 | Fischer et al. |
| 2005/0113052 | A1 | 5/2005 | Rabinovich |
| 2005/0151698 | A1 | 7/2005 | Mohamadi |
| 2006/0170499 | A1 | 8/2006 | Rahman et al. |
| 2007/0248186 | A1 | 10/2007 | Sorrells et al. |
| 2007/0275674 | A1 | 11/2007 | Chein |
| 2007/0280384 | A1 | 12/2007 | Hidaka |
| 2008/0129408 | A1 | 6/2008 | Nagaishi |
| 2008/0129634 | A1 | 6/2008 | Pera |
| 2008/0218424 | A1 | 9/2008 | Blanton |
| 2009/0091384 | A1 | 4/2009 | Sorrells et al. |
| 2010/0073085 | A1 | 3/2010 | Sorrells et al. |
| 2010/0097138 | A1 | 4/2010 | Sorrells et al. |
| 2010/0225389 | A1 | 9/2010 | Teetzel |
| 2010/0321107 | A1 | 12/2010 | Honcharenko |

FOREIGN PATENT DOCUMENTS

| | | |
|---|---|---|
| EP | 1193861 | 4/2002 |
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

International Search Report and Written Opinion dated Nov. 18, 2010, PCT/US10/30871, 10 pages.
International Search Report and Written Opinion dated Nov. 26, 2010, PCT/US10/30868, 10 pages.
International Search Report and Written Opinion dated Nov. 26, 2010, PCT/US10/30877, 10 pages.
Tokumitsu et al.—Active isolator, combiner, divider and magic-T as miniaturized function blocks dated Nov. 6, 1998.
International Search Report and Written Opinion dated Nov. 26, 2010, PCT/US10/30866, 8 pages.
Aminghasem Safarian et al., Distributed Active Power Combiners and Splitters for Multi-Antenna UWB.
Viallon et al. An Original SiGe Active Differential Output Power Splitter for Millimetre-wave Applications, 2003.
International Search Report and Written Opinion dated Nov. 26, 2010, PCT/US10/30892, 9 pages.
International Search Report and Written Opinion dated Nov. 26, 2010, PCT/US10/30872, 9 pages.
Hsiao Analysis of Interleaved Arrays of Nov. 1971.
International Search Report and Written Opinion dated Nov. 30, 2010, PCT/US10/30906, 11 pages.
USPTO; Office Action dated Apr. 7, 2011 in U.S. Appl. No. 12/759,064.
Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.
Ayari et al., "Automatic Test Vector Generation for Mixed-Signal Circuits," 1995, Ecole Polytechnique of the University of Montreal, 6 pages.
Strassberg, Dan, "RF-vector-signal generator combines high throughput, low phase noise," EDN, Oct. 6, 2009, 2 pages, UBM Electronics.
International Search Report and Written Opinion dated Jul. 19, 2010,PCT US10/030881, 149 pages.
International Search Report and Written Opinion dated Aug. 23, 2010,PCT/US2010/30864, 12 pages.
Kwang-Jin, Koh, Gabriel M. Rebeiz, 0.13-mu m CMOS phase shifters for X-, Ku, and K-band phased arrays, IEEE Journal of Solid State Circuits, 2007, 14 pages.
Kwang-Jin, Koh, Jason W. May, Gabriel M. Rebeiz A Q-Band (40-45 GHz) 16-Element Phased-Array Transmitter in 0.18-μm SiGe BiCMOS Technology, IEEE Radio Frequency Integrated Circuits Symposium, 2008, 4 pages.
Kwang-Jin, Koh, Gabriel M. Rebeiz, An X- and Ku-Band 8-Element Phased-Array Receiver in 0.18-μm SiGe BiCMOS Technology, IEEE Journal of Solid State Circuits, Jun. 2008, 12 pages.
International Preliminary Report on Patentability dated Jul. 21, 2011 from PCT/US2010/030877.
International Preliminary Report on Patentability dated Jul. 21, 2011 from PCT/US10/30906.
International Preliminary Report on Patentability dated Jul. 21, 2011 from PCT/US10/30892.
Office Action dated Sep. 29, 2011 from U.S. Appl. No. 12/759,059.
International Preliminary Report dated Oct. 27, 2011 from PCT/US10/030864.
International Preliminary Report dated Oct. 27, 2011 from PCT/US10/30868.
International Preliminary Report dated Oct. 27, 2011 from PCT/US10/030881.
International Preliminary Report dated Oct. 27, 2011 from PCT/US10/30872.
International Preliminary Report dated Oct. 27, 2011 from PCT/US10/30871.
International Preliminary Report dated Oct. 27, 2011 from PCT/US10/30866.
International Preliminary Report dated Oct. 27, 2011 from PCT/US10/030876.
Office Action dated Feb. 27, 2012 in U.S. Appl. No. 12/759,130.
Notice of Allowance dated Feb. 28, 2012 in U.S. Appl. No. 12/759,059.
Office Action dated May 7, 2012 in U.S. Appl. No. 12/759,113.
Notice of Allowance dated Jul. 27, 2011 in U.S. Appl. No. 12/759,064.
Office Action dated Aug. 2, 2012 in U.S. Appl. No. 12/758,996.
Notice of Allowance dated May 10, 2012 in U.S. Appl. No. 12/759,130.
Office Action dated May 17, 2012 in U.S. Appl. No. 12/759,043.
Supplemental Notice of Allowability dated May 29, 2012 in U.S. Appl. No. 12/759,130.
Office Action dated May 29, 2012 in U.S. Appl. No. 12/759,123.
Supplemental Notice of Allowability dated Jun. 11, 2012 in U.S. Appl. No. 12/759,130.

* cited by examiner

ACTIVE POWER SPLITTER

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

FIELD OF INVENTION

A system and method for active power splitting is provided. Specifically, a circuit topology in accordance with a system, method and device for an active power splitter which allows the use of negative feedback and thus improving stability and linearity without substantially increasing the noise figure of the system is provided.

BACKGROUND OF THE INVENTION

Generally, power splitters are passive devices. A power splitter may include an input signal and generally two or more output signals. However, using a conventional power splitter each output signal is about 3 dB lower in power than the input signal. Also, the noise characteristics of some power splitter devices are unsatisfactory for some high frequency applications.

Thus, a need exists for circuit topology which allows for neutral or increased power in each output signal as compared with the input signal. Also, a need exists for circuit topology which improves stability and linearity without substantially increasing the noise figure of the system.

SUMMARY

In an exemplary embodiment, a method for active power splitting includes coupling a plurality of three terminal devices is disclosed. In this exemplary embodiment, the plurality of three terminal devices comprises at least one of: (1) a common emitter stage-common collector stage topology, and (2) a common source stage-common drain stage topology.

In an exemplary embodiment, an active power splitter system includes an active power splitter input; a first active power splitter output; a second active power splitter output; and a plurality of field effect transistors. In an exemplary embodiment, the plurality of field effect transistors includes a common source stage-common drain stage topology. In this exemplary embodiment, the common source stage is associated with the active power splitter input. In this exemplary embodiment, the common drain stage is associated with the first and second active power splitter outputs.

In an exemplary embodiment, an active power splitter system including an active power splitter input; a first active power splitter output; a second active power splitter output; and a plurality of three terminal devices. In this exemplary embodiment, the plurality of three terminal devices include one of: (1) a common emitter stage-common collector stage topology, wherein the common emitter stage is associated with the active power splitter input, and wherein the common collector stage is associated with the first and second active power splitter outputs, and (2) a common source stage-common drain stage topology, wherein the common source stage is associated with the active power splitter input, and wherein the common drain stage is associated with the first and second active power splitter outputs.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

Figure 1A:
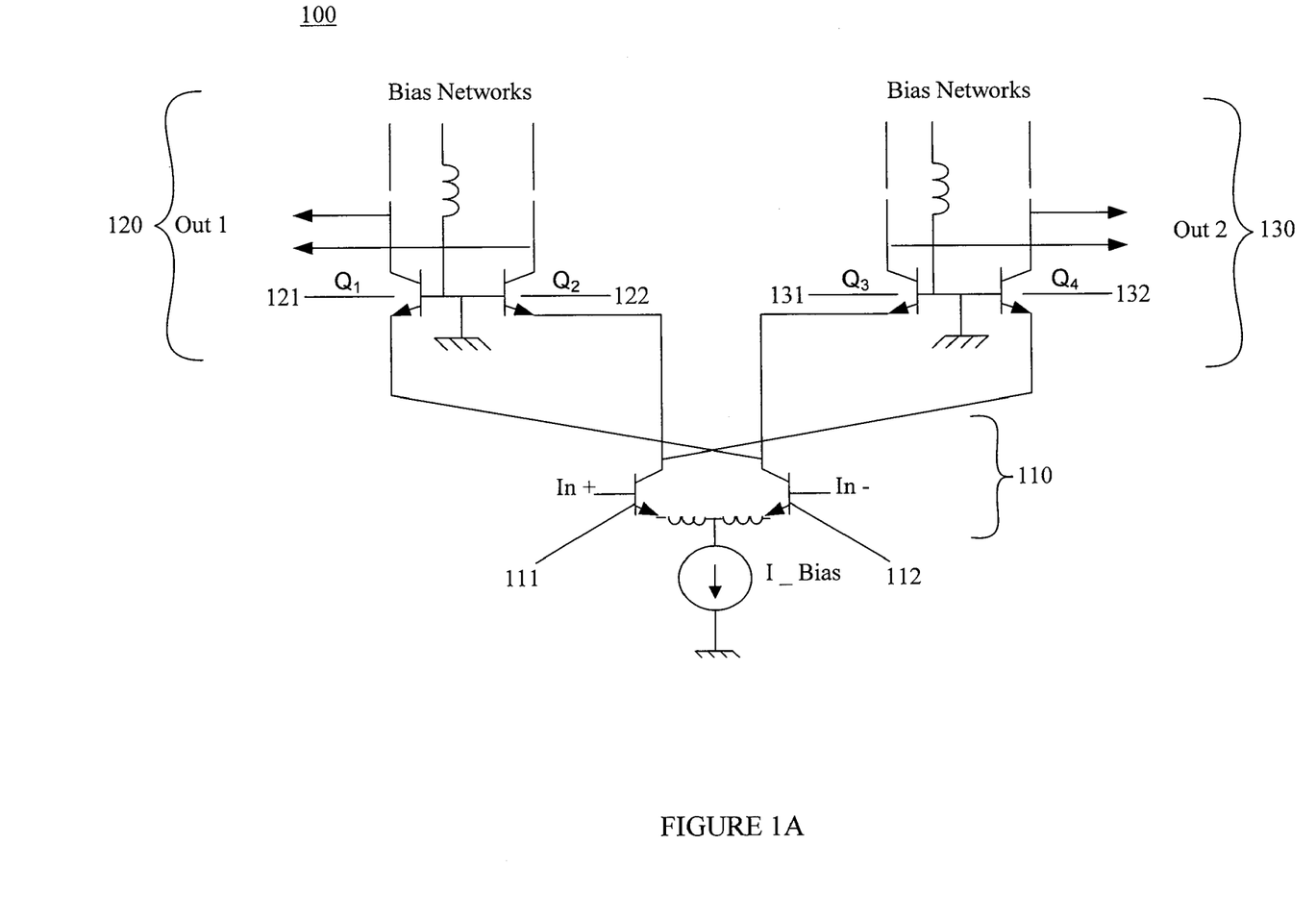
FIG. 1A illustrates an exemplary embodiment of an active power splitter.

With reference to FIG. 1A, one exemplary active power splitter comprising a cascode (common emitter-common base) topology using bipolar transistors (or a common source-common gate topology using field effect transistors) is provided. This topology may result in a system which may be sensitive to negative feedback at the emitter of the common emitter stage (i.e. at the source of the common source state when using field effect transistors). Using the topology of FIG. 1A, a degradation in noise figure may be experienced. This degradation in noise figure may be due to increased injection from second channel devices into the first channel, such as from second channel device Q3 to first channel device Q1 and/or from second channel device Q4 to first channel device Q2 and vice versa. Also, due to layout parasitics, a small amount of parasitic feedback inductance and resistance will be present with the circuit topology of FIG. 1A. This parasitic inductance and resistance may degrade circuit performance such as noise figure.

Figure 1B:
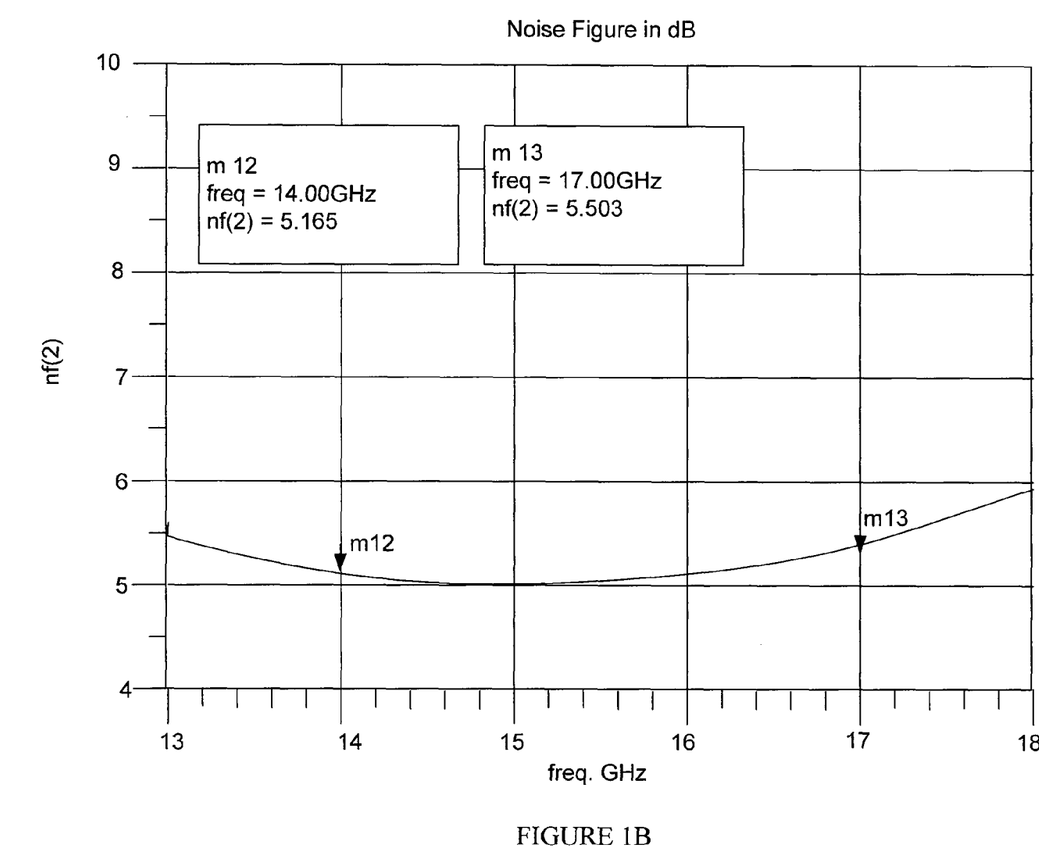
FIG. 1B illustrates an exemplary noise figure of the embodiment associated with FIG. 1A.
Figure 1C:
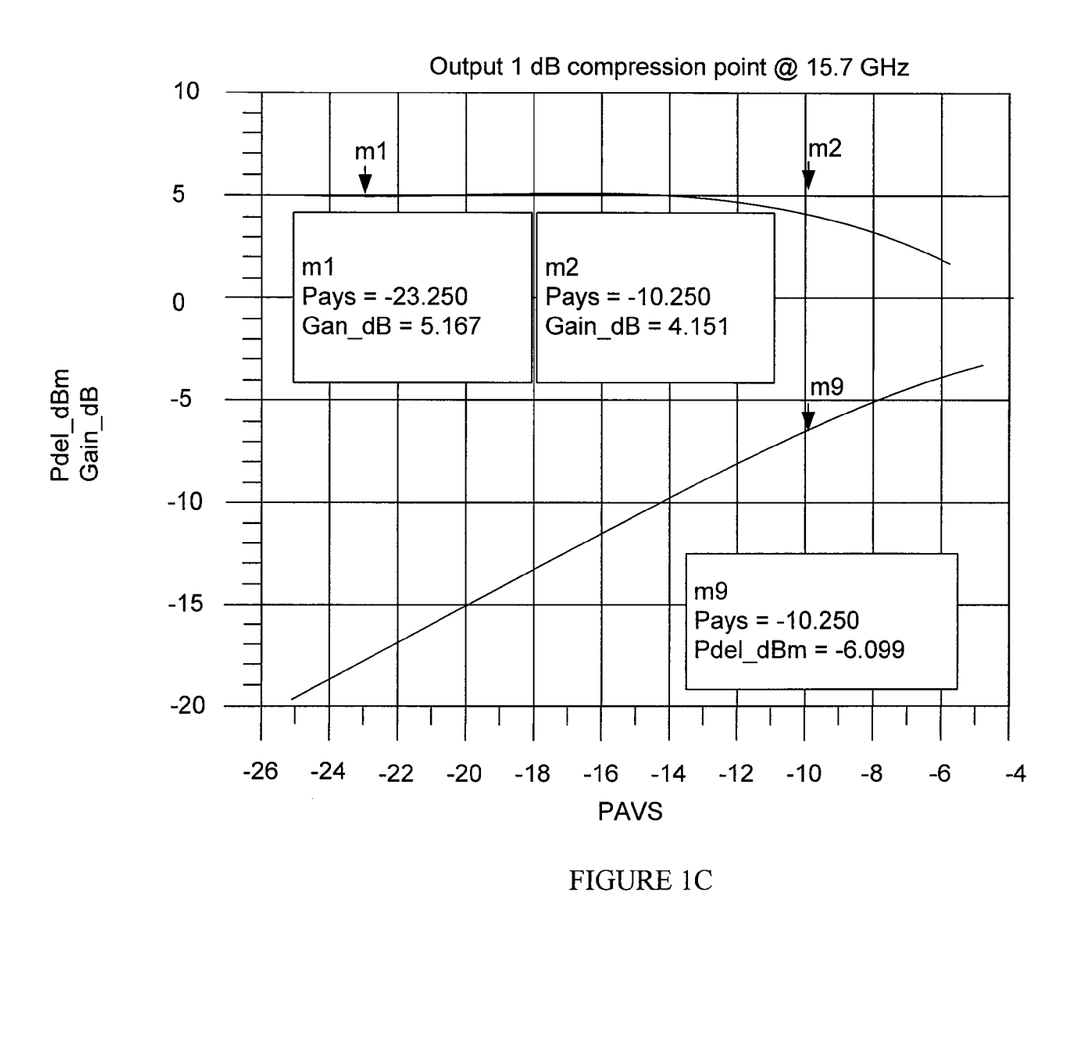
FIG. 1C illustrates an exemplary output P1 dB compression point associated with an embodiment of FIG. 1A.
Figure 1D:
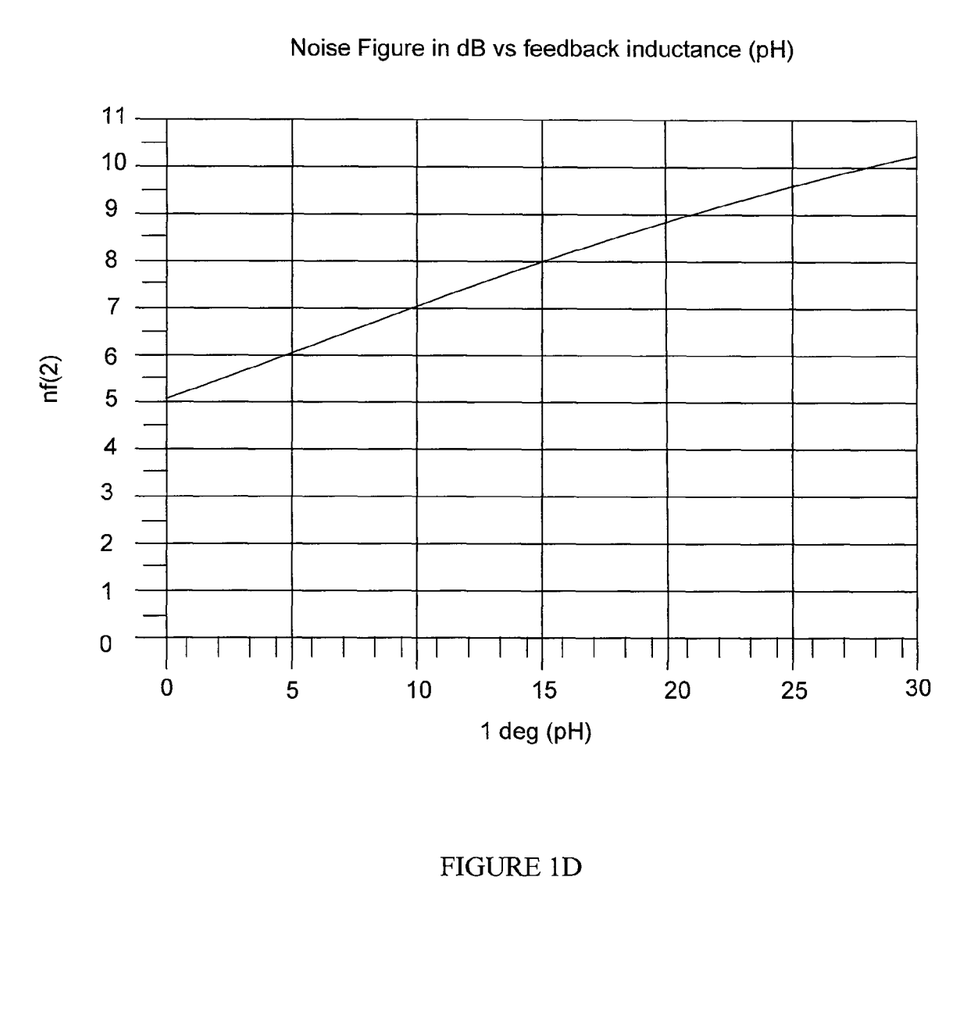
FIG. 1D illustrates an exemplary noise figure, in dB vs. feedback inductance (pH), of the embodiment associated with FIG. 1A.

Utilizing the system of FIG. 1A, with reference to FIGS. 1B and 1C, graphs depicting the noise figure and output P1 dB compression point (a measure of linearity defined as the output power achieved when power gain decreases (or compressed) by one dB) of the system depicted in FIG. 1A is provided. In this embodiment, small signal gain was designed to be around 5 dB. A noise figure of about 5.1 dB and OP 1 dB of −6 dBm was obtained at 15.7 GHz. FIG. 1D depicts the noise figure increasing with feedback inductance located at the emitter of the input transistors of the common emitter stage of the system depicted in FIG. 1A. It is noted that the noise figure has increased from 5 dB at 0 pH to greater than 10 dB at 30 pH. With renewed reference to FIG. 1A, 30 pH of inductance is generally going to be present in practical physical implementations and topologies of the various systems. For instance, the stripline used to couple elements to a DC current sink will generally inject about 20 pH of inductance.

Figure 2:
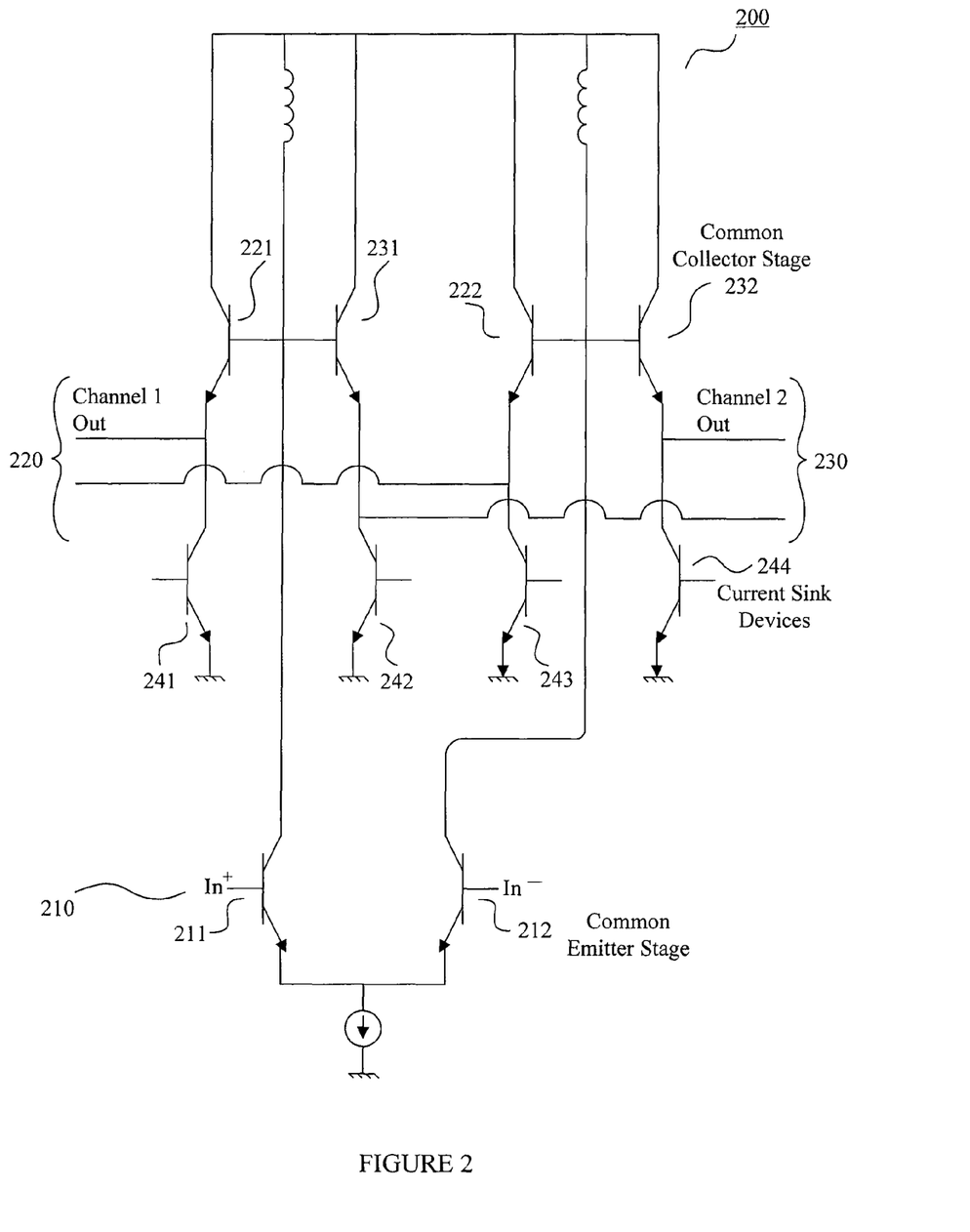
FIG. 2 illustrates an exemplary embodiment of another active power splitter comprising a common emitter-common collector topology.

In an exemplary embodiment and with reference to FIG. 2, an active power splitter schematic is provided. In one exemplary embodiment, system 200 comprises a common emitter-common collector topology. The topology of system 200 is designated common emitter-common collector topology due to the combination of common emitter and common collector stages. One advantage, which will be described further below, of the topologies described herein is a reduced noise figure. In an exemplary embodiment, as described further below, system 200 utilizes negative feedback coupled to the common emitter stage to reduce gain without sacrificing noise figure. Another advantage, which will be described further below, of the topologies described herein is improved linearity of transmitters, receivers and transceivers such as phased array (transmitters, receivers and transceivers) utilizing the provided active power splitter topology.

FIG. 2 illustrates a schematic of an exemplary active power splitter 200. In an exemplary embodiment, an active power splitter 200 comprises a differential input subcircuit 210, a first differential output subcircuit 220, and a second differential output subcircuit 230.

The differential input subcircuit 210 includes paired transistors 211, 212 with a common emitter node. This common emitter node is constant current biased, as is typical in a differential amplifier. In one exemplary embodiment, a virtual ground is created at a midpoint of (1) a constant current signal and (2) a 180 degree out of phase portion of that constant current signal. In one exemplary embodiment, an input signal is communicated to the base of paired transistors 211, 212 in the differential input subcircuit 210. In an exemplary embodiment, both the first and second differential output subcircuits 220, 230 comprise a pair of transistors with a common base node and each common base is connected to ground.

In an exemplary embodiment, both the first and second differential output subcircuits 220, 230 comprise a pair of three terminal devices (e.g. transistors 221, 222, and transistors 231, 232 respectively) with a common collector stage. For instance, in an exemplary embodiment, the first differential output subcircuit 220 comprises a pair of transistors, such as transistor 221 and transistor 222. In an exemplary embodiment, transistors 221 and 222 are BJTs. In another exemplary embodiment, transistors 221 and 222 are FETs. In this exemplary embodiment, the second differential output subcircuit 230 comprises a pair of transistors, such as transistor 231 and transistor 232. In an exemplary embodiment, transistors 231 and 232 are BJTs. In another exemplary embodiment, transistors 231 and 232 are FETs. In one exemplary embodiment, the common collectors are tied to at least one bias network. In one exemplary embodiment, each emitter of transistors 221, 222, 231, and 232, is connected to a current sink device 241, 243, 242, and 244 respectively.

In one exemplary embodiment, a current sink device may be provided by a circuit element where the current through it is independent of the voltage across it, generally referred to as an ideal current source or ideal current element in circuit theory. In one exemplary embodiment, transistors are used as current sources and/or current sinks in practice (source and sink can be used interchangeably). In one exemplary embodiment, the DC current does change with voltage but only slightly, thus the elements are non-ideal. For instance, the (non-ideal) current element may be a three terminal device such as a BJT, FET, HBT, pHEMT and/or or MOSFET with the base held at constant voltage. The current sink devices 241, 243, 242, and 244 act to establish fixed bias currents in output transistors 221, 222, 231, 232, respectively. In one exemplary embodiment, the emitters of transistors 221, 222, 231, and 232 are connected to the collectors of current sink devices 241, 243, 242, and 244, respectively. In one exemplary embodiment, the emitters of current sink devices 241, 243, 242, and 244 are tied to ground.

In an exemplary embodiment and with renewed reference to FIG. 2, the first differential output subcircuit 220 has a first transistor 221 base connected to the collector of input subcircuit transistor 211. The second output subcircuit transistor 222 base is connected to the other input subcircuit transistor 212 collector. In the exemplary embodiment, the first output is drawn from transistor 221 emitter and transistor 222 emitter of the first differential output subcircuit, (e.g. channel 1 220). Furthermore, the second differential output subcircuit 230 is similarly connected, except the second differential output subcircuit 230 has a first transistor 231 base connected to input subcircuit transistor 211 collector. The second output subcircuit transistor 232 base is connected to the other input subcircuit transistor 212 collector. In the exemplary embodiment, the second output is drawn from transistor 231 emitter and transistor 232 emitter of the second differential output subcircuit 230. In one exemplary embodiment, transistor 221 base and transistor 231 base share a common node. Similarly, transistor 222 base and transistor 232 base share a common node.

In contrast to the topology associated with FIG. 1A, in one exemplary embodiment and with renewed reference to FIG. 2, channel 1 transistor emitters, such as transistor 221 emitter and transistor 222 emitter, are not connected to the channel 2 transistor emitters, such as transistor 231 emitter and transistor 232 emitter. Thus, the emitters of channel 1 220 and channel 2 230 transistors are electrically isolated. By way of contrast, and with renewed reference to FIG. 1A, channel 1 transistor 121 emitter and channel 2 transistor 131 emitter are coupled to each other via a common node at the collector of transistor 112. Similarly, channel 1 transistor 122 emitter and channel 2 transistor 132 emitter are coupled to each other via a common node at the collector of transistor 111. With renewed reference to FIG. 2, the only connection between the two output differential output transistor pairs 221, 222 and 231, 232 is through the connection between the emitter of transistors 211 and 212. In one exemplary embodiment, the virtual short at the emitter of transistors 211 and 212 prevents transistors in the first output circuit from injecting noise into the transistors in the second output circuit. Similarly the virtual short at the emitter of transistors 211 and 212 prevents transistors in the second output circuit from injecting noise into the transistors in the first output circuit.

Figure 3:
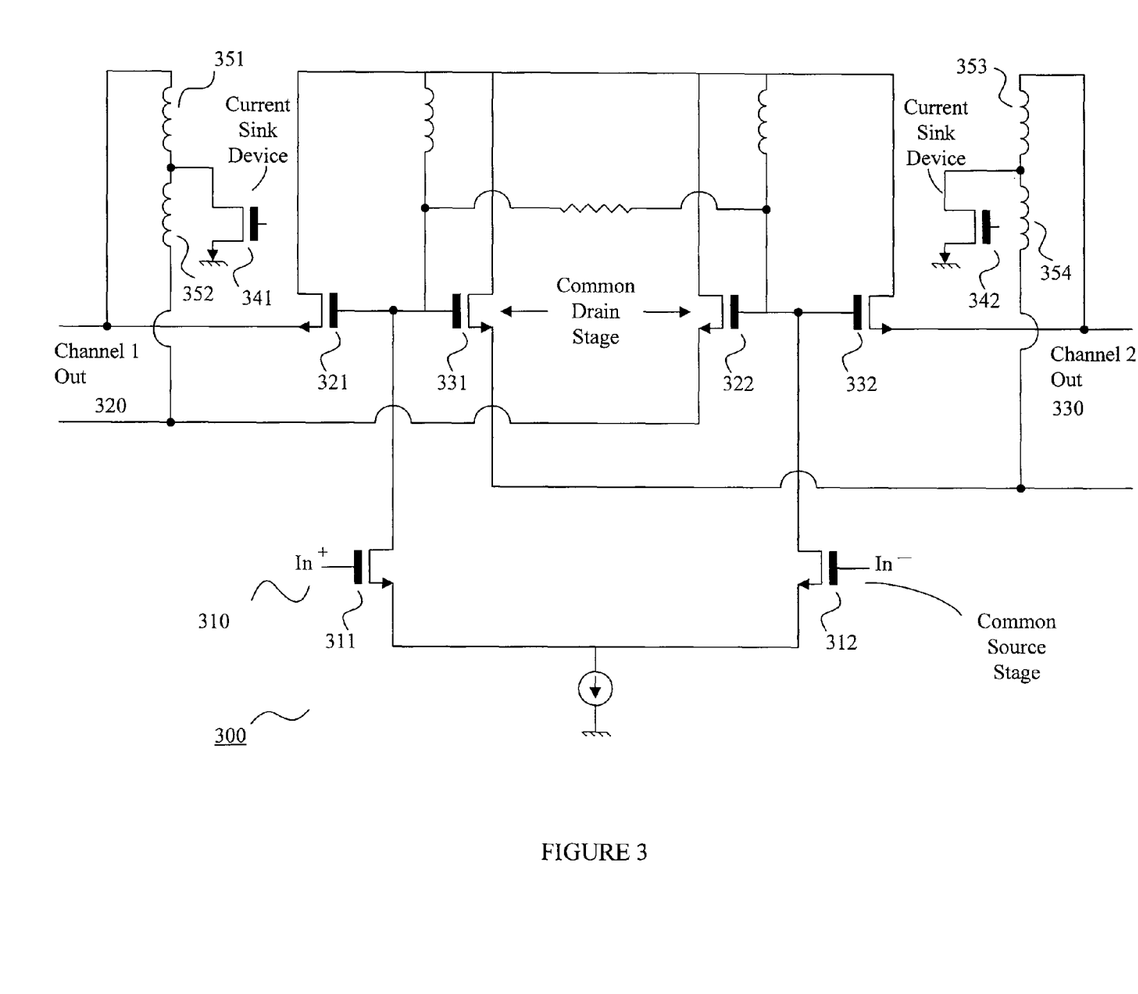
FIG. 3 illustrates an exemplary embodiment of yet another active power splitter comprising a common source-common drain topology with inductors coupled to the current sink devices.

In an exemplary embodiment and with renewed reference to FIG. 3, the first differential output subcircuit 320 has a first transistor 321 gate connected to the drain of one of the input subcircuit transistors 311. The second output subcircuit transistor 322 gate is connected to the drain of the other input subcircuit transistor 312. In the exemplary embodiment, the first output is drawn from the first differential output subcircuit 320 transistor 321 source and transistor 322 source terminals. Furthermore, the second differential output subcircuit 330 is similarly connected, except the second differential output subcircuit 330 has a first transistor 331 gate connected to the drain of the input subcircuit transistor 311. The second output subcircuit transistor 332 gate is connected to the drain of the other input subcircuit transistor 312. In the exemplary embodiment, the second output (e.g. channel 2 330) is drawn from the second differential output transistor 331 source and transistor 332 source terminals.

In one exemplary embodiment, a first current sink device 341 is coupled to a device capable of storing energy, such as a first inductor 351 and/or a second inductor 352. In this exemplary embodiment the source of transistor 321 is coupled to inductor 351. In turn, inductor 351 is then coupled to the drain of current sink device 341. In this exemplary embodiment, the source of transistor 322 is coupled to inductor 352. Inductor 352 is then coupled to the drain of current sink device 341. In this exemplary embodiment, a second current sink device 342 is coupled to a device capable of storing energy, such as a third inductor 353 and a fourth inductor 354. In this exemplary embodiment, the source of transistor 331 is coupled to inductor 354. Inductor 354 is then coupled to the drain of current sink device 342. In this exemplary embodiment, the source of transistor 332 is coupled to inductor 353. In turn, inductor 353 is then coupled to the drain of current sink device 342. Each source of the current sink devices 353, 354 may be connected to ground.

The current sink devices may inject noise into the system. Devices capable of storing energy, such as inductors 351, 352, 353, and 354, may be configured to reduce the noise injected by the current sink devices. Since the signals appearing at the sources of transistors 321 and 322 are substantially 180° out of phase, a virtual short appears at the drain of current sink device 341. The virtual short thus reduces any noise generated by the current sink device 341. Similarly since the signals appearing at the sources of transistors 331 and 332 are substantially 180° out of phase, a virtual short appears at the drain of current sink device 342. The virtual short thus reduces any noise generated by the current sink device 342. As long as the inductors 351, 352 are of equal value or similarly the inductors 353, 354 are of equal value, any suitable amount of inductance may be selected to reduce the noise injected by the current sink device. For instance, between 10 pH and 1 uH may be used as deemed by the circuit designer as appropriate for the frequency of application.

This system may be used to split or divide input signals by any integer N channels. Though only two channels have been depicted in the figures it should appreciated that the concept can be extended to N integer channels. In one exemplary embodiment an active power splitter layout and/or topology is configured to have substantially symmetric output channels. The system is configured to be symmetric where possible. Similarly, as this concept is extended to N integer channels it shall be appreciated that the N integer channels system is configured to be symmetric where possible.

The active power splitters described thus far, with reference to FIGS. 2 and 3 have been configured such that the outputs are approximately in phase with each other and/or with the input. In contrast, in accordance with another exemplary embodiment, transistor 231, 232 emitters can be swapped causing the first output and the second output to be approximately 180° out of phase with each other. In general, the absolute phase shift of the output signals through the power splitter is not as important as the relative phasing between the first and second output signals.

In an exemplary embodiment, active power splitter 200 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 200, 300, can provide gain and the relative power level between the input signal and the output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may achieve a power gain in the 0 dB to 5 dB range. Moreover, the output signal may be configured to achieve any suitable power gain.

In another exemplary embodiment, active power splitter 200, 300 additionally provides matched impedances at the input and output ports. The matched impedances may be 50 ohms, 75 ohms, or other suitable impedances. Furthermore, in an exemplary embodiment, active splitter 200, 300 provides isolation between the output ports of the active power splitter. In one exemplary embodiment, active power splitter 200, 300 is manufactured as a monolithic microwave integrated circuit (MMIC). In one exemplary embodiment, active power splitter 200, 300 is manufactured as a radio frequency integrated circuit (RFIC) with a compact size that is independent of the operating frequency due to a lack of distributed components.

In accordance with an exemplary embodiment, active power splitter 200 may comprise active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed network in the prior art. In one exemplary embodiment, RF signals undergo a neutral or slight positive power gain, rather than power losses that occur in the passive prior art systems. Furthermore, some exemplary embodiments employ differential signaling to improve signal isolation, interference rejection, and noise immunity, plus confine electromagnetic fields, when the RF signal is in analog form.

Figure 4:
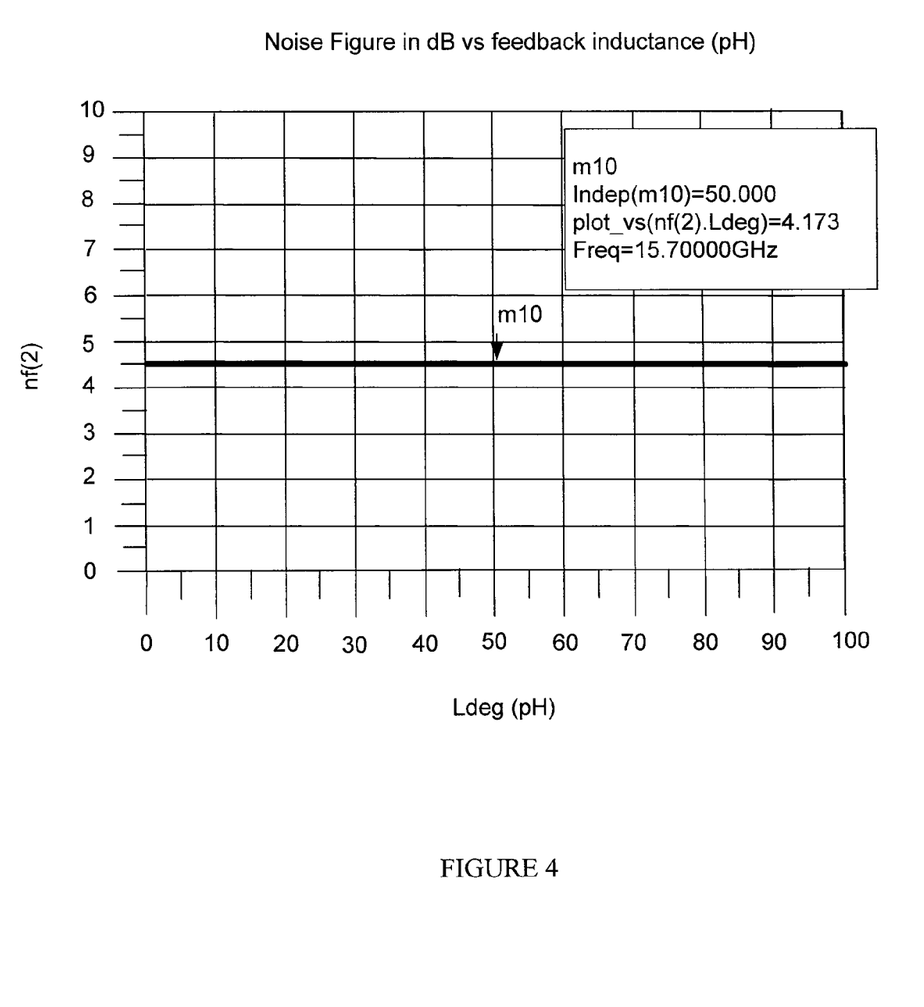
FIG. 4 illustrates an exemplary noise figure associated with an exemplary embodiment of an active power splitter comprising a common emitter-common collector topology.

In contrast to the previously described FIGS. 1B-1D and with reference to FIG. 4, an exemplary embodiment noise figure is provided. In one exemplary embodiment, the noise figure dB versus feedback inductance in (pH) is provided. The noise figure is both highly linear and has an operationally satisfactory small change in dB over the inductance range. For instance, the change in noise figure over the 0 to 100 pH range is less than about 0.25 dB. Also, at an exemplary frequency of 15.7 GHz the noise figure of an exemplary embodiment of an active power splitter is relatively constant at 4.173 dB compared to about 4.35 dB at 0 pH and about 4.3 dB at 100 pH.

In an exemplary embodiment, active power splitter 200, 300 has a wide operating bandwidth such as (between 1-250 GHz) and can be configured for broadband enabled operation over multiple frequency bands. In other words, in an exemplary embodiment, active power splitter 200, 300 is applicable to all frequency bands, including X, K, Ku, Ka, and Q bands. In an exemplary embodiment, the active power splitter 200, 300 operates over specific frequency ranges, such as 2-20 GHz, 20-40 GHz, 30-45 GHz, or other suitable ranges.

In an exemplary embodiment, the active power splitter is manufactured as an RFIC or MMIC. In an exemplary embodiment, a noise figure for the active power splitter has a gain of less than 0.25 dB change for negative feedback inductance from 0 to 100 pH. In an exemplary embodiment, the current sink devices are three terminal devices. In this exemplary embodiment, at least one of the base and the gate of the three terminal current sink device is held at a constant voltage or current. In an exemplary embodiment, the virtual ground is created at the midpoint of an alternating current source split into two signals with 180 degree out of phase separation.

In addition, reference is made to a FET (field effect transistor) however, it should be appreciated and understood by one skilled in the art that various other transistors may appropriately be used in the present invention, for example, bipolar junction transistors (BJTs), MOSFETs, MESFETs, diode, HEMT (high electron mobility transistors), and/or heterojunction bipolar transistors (HBTs). Similarly, reference is made to a source, drain and gate of the FET, however, it should be appreciated and understood by one skilled in the art that various other reference may be made in place of source, drain and gate (such as emitter, collector, and base, or an input and an output). Additionally, physically a source may be operated as a drain and an associated drain may be operated as a source.

The following applications are related to this subject matter: U.S. application Ser. No. 12/759,123, entitled "ACTIVE BUTLER AND BLASS MATRICES," which is being filed contemporaneously herewith; U.S. application Ser. No. 12/759,043, entitled "ACTIVE HYBRIDS FOR ANTENNA SYSTEMS," which is being filed contemporaneously herewith; U.S. application Ser. No. 12/759,064, entitled "ACTIVE FEED FORWARD AMPLIFIER," which is being filed contemporaneously herewith; U.S. application Ser. No. 12/759,130, entitled "ACTIVE PHASED ARRAY ARCHITECTURE," which is being filed contemporaneously herewith; U.S. application Ser. No. 12/759,059, entitled "MULTI-BEAM ACTIVE PHASED ARRAY ARCHITECTURE," which is being filed contemporaneously herewith; U.S. application Ser. No. 12/758,996, entitled "PRESELECTOR AMPLIFIER," which is being filed contemporaneously herewith; U.S. application Ser. No. 12/759,112, entitled "HALF-DUPLEX PHASED ARRAY ANTENNA SYSTEM," which is being filed contemporaneously herewith; U.S. application Ser. No. 12/759,113, entitled "DIGITAL AMPLITUDE CONTROL OF ACTIVE VECTOR GENERATOR," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. An active power splitter system comprising:
   an active power splitter differential input;
   a first active power splitter differential output;
   a second active power splitter differential output; and
   a plurality of three terminal devices; wherein the plurality of three terminal devices comprise one of:
   a common emitter stage-common collector stage topology, wherein the common emitter stage is in communication with the active power splitter differential input, and wherein the common collector stage provides a first differential output signal to the first active power splitter differential output, and wherein the common collector stage provides a second differential output signal to the second active power splitter differential output, and
   a common source stage-common drain stage topology, wherein the common source stage is in communication with the active power splitter differential input, and wherein the common drain stage provides the first differential output signal to the first active power splitter differential output, and wherein the common drain stage provides the second differential output signal to the second active power splitter differential output.

2. The active power splitter system of claim 1, wherein the three terminal devices comprise at least one of a BJT, a FET, a HBT, a pHEMT and a MOSFET.

3. The active power splitter system of claim 1, further comprising a differential input virtual ground coupled to the common emitter stage.

4. The active power splitter system of claim 1, further comprising a current sink device biasing at least one of the common collector stage and the common drain stage.

5. The active power splitter system of claim 4, further comprising an inductor coupled to the current sink device.

6. The active power splitter system of claim 1, further comprising
   one of a first channel common collector stage and a second channel common collector stage, wherein the first channel common collector stage comprises a plurality of three terminal devices and wherein the second channel common collector stage comprises a plurality of three terminal devices, and
   a first channel common drain stage and a second channel common drain stage, wherein the first channel common drain stage comprises a plurality of three terminal devices and wherein the second channel common drain stage comprises a plurality of three terminal devices.

7. The active power splitter system of claim 6, wherein at least one of the first channel common collector stage three terminal device emitter terminals are not coupled to the second channel common collector stage three terminal device emitter terminals, and the first channel common drain stage three terminal device source terminals are not coupled to the second channel common drain stage three terminal device source terminals.

8. The active power splitter system of claim 1, wherein a noise figure for the active power splitter is configured to be less than about 4.2 dB.

9. The active power splitter system of claim 1, wherein an output P1 dB compression point for the active power splitter is configured to be less than about 3.2 dBm.

10. The active power splitter system of claim 1, wherein the active power splitter is configured to comprise a plurality of substantially symmetric output channels.

11. The active power splitter system of claim 1, wherein the active power splitter is configured to comprise a noise figure of less than 5 dB.

12. The active power splitter system of claim 1, wherein the active power splitter is configured to operate at a frequency between about 1 and about 250 GHz and over a bandwidth of 20 GHz.

13. The active power splitter system of claim 1, wherein the active power splitter is configured to provide gain.

14. The active power splitter system of claim 1, wherein the active power splitter is configured to provide adjustable relative power between an input signal and output signals.

15. The active power splitter system of claim 1, wherein an active power splitter differential output signal is configured to achieve at least one of a substantially neutral power gain over an input signal or a positive power gain over an input signal.

16. The active power splitter system of claim 1, wherein the active power splitter is configured to provide isolation between output ports of the active power splitter.

17. The active power splitter system of claim 1, wherein a differential phase between a plurality of output signals of the active power splitter is substantially zero.

18. An active power splitter method comprising:
coupling a plurality of three terminal devices; wherein the plurality of three terminal devices comprise at least one of:
a common emitter stage-common collector stage topology, wherein the common emitter stage is in communication with an active power splitter differential input and wherein the common collector stage comprises a first active power splitter differential output and a second active power splitter differential output both located at the common collector stage; and
a common source stage-common drain stage topology, wherein the common source stage is in communication with an active power splitter differential input and wherein the common drain stage comprises a first active power splitter differential output and a second active power splitter differential output both located at the common drain stage.

19. An active power splitter system comprising:
an active power splitter differential input;
a first active power splitter differential output;
a second active power splitter differential output; and
a plurality field effect transistors comprising;
a common source stage-common drain stage topology, wherein the common source stage is in communication with the active power splitter differential input, and wherein the common drain stage provides a first differential output signal to the first active power splitter differential output, and wherein the common drain stage provides a second differential output signal to the second active power splitter differential output;
wherein the first active power splitter differential output is located at a first output of the common drain stage, and wherein the second active power splitter differential output is located at a second output of the common drain stage.

* * * * *